(12) United States Patent
Takemoto et al.

(10) Patent No.: US 12,123,773 B2
(45) Date of Patent: Oct. 22, 2024

(54) VOLTAGE CONTROL SYSTEM

(71) Applicant: Panasonic Intellectual Property Management Co., Ltd., Osaka (JP)

(72) Inventors: Masato Takemoto, Osaka Fu (JP); Shota Yamada, Shiga Ken (JP); Shinzo Koyama, Osaka Fu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/461,314

(22) Filed: Sep. 5, 2023

(65) Prior Publication Data

US 2023/0408331 A1 Dec. 21, 2023

Related U.S. Application Data

(63) Continuation of application No. PCT/JP2022/014310, filed on Mar. 25, 2022.

(30) Foreign Application Priority Data

Mar. 31, 2021 (JP) ................. 2021-061118

(51) Int. Cl.
*G01J 1/44* (2006.01)
*H01L 31/02* (2006.01)
*H04N 25/772* (2023.01)

(52) U.S. Cl.
CPC .......... *G01J 1/44* (2013.01); *H01L 31/02027* (2013.01); *H04N 25/772* (2023.01); *G01J 2001/4466* (2013.01); *G01J 2001/448* (2013.01)

(58) Field of Classification Search
CPC ................. G01J 1/44; G01J 2001/4466; G01J 2001/448; H01L 31/02027; H04N 25/772
See application file for complete search history.

(56) References Cited

U.S. PATENT DOCUMENTS

2001/0023944 A1 9/2001 Maruyama et al.
2013/0050475 A1 2/2013 Ito
(Continued)

FOREIGN PATENT DOCUMENTS

EP 1006591 A2 6/2000
JP 2000-171295 A 6/2000
(Continued)

OTHER PUBLICATIONS

International Search Report dated Jun. 14, 2022 issued in International Patent Application No. PCT/JP2022/014310, with English translation.

*Primary Examiner* — Thanh Luu
*Assistant Examiner* — Monica T Taba
(74) *Attorney, Agent, or Firm* — Rimon P.C.

(57) ABSTRACT

A voltage control system has a light receiving array part receiving incident light and a light shielding array part shielding light receiving elements from incident light by a light shielding mechanism. The voltage control system also includes: a voltage application unit applying a bias voltage to an anode terminal; a multiplication state determination unit determining the multiplication state of the light shielding array part based on output signals from cathodes of the light receiving elements in the light shielding array part; and a voltage setting unit performing voltage setting for the bias voltage to be output from the voltage application unit based on the determination results from the multiplication state determination unit.

8 Claims, 11 Drawing Sheets

(56) References Cited

U.S. PATENT DOCUMENTS

2020/0314375 A1  10/2020  Nishino et al.
2021/0074743 A1   3/2021  Ta et al.
2021/0223098 A1*  7/2021  Ledvina .................... G01J 1/44

FOREIGN PATENT DOCUMENTS

| JP | 2001-267621 A | 9/2001 |
| JP | 2011-244076 A | 12/2011 |
| JP | 2019-075394 A | 5/2019 |
| JP | 2021-039066 A | 3/2021 |

* cited by examiner

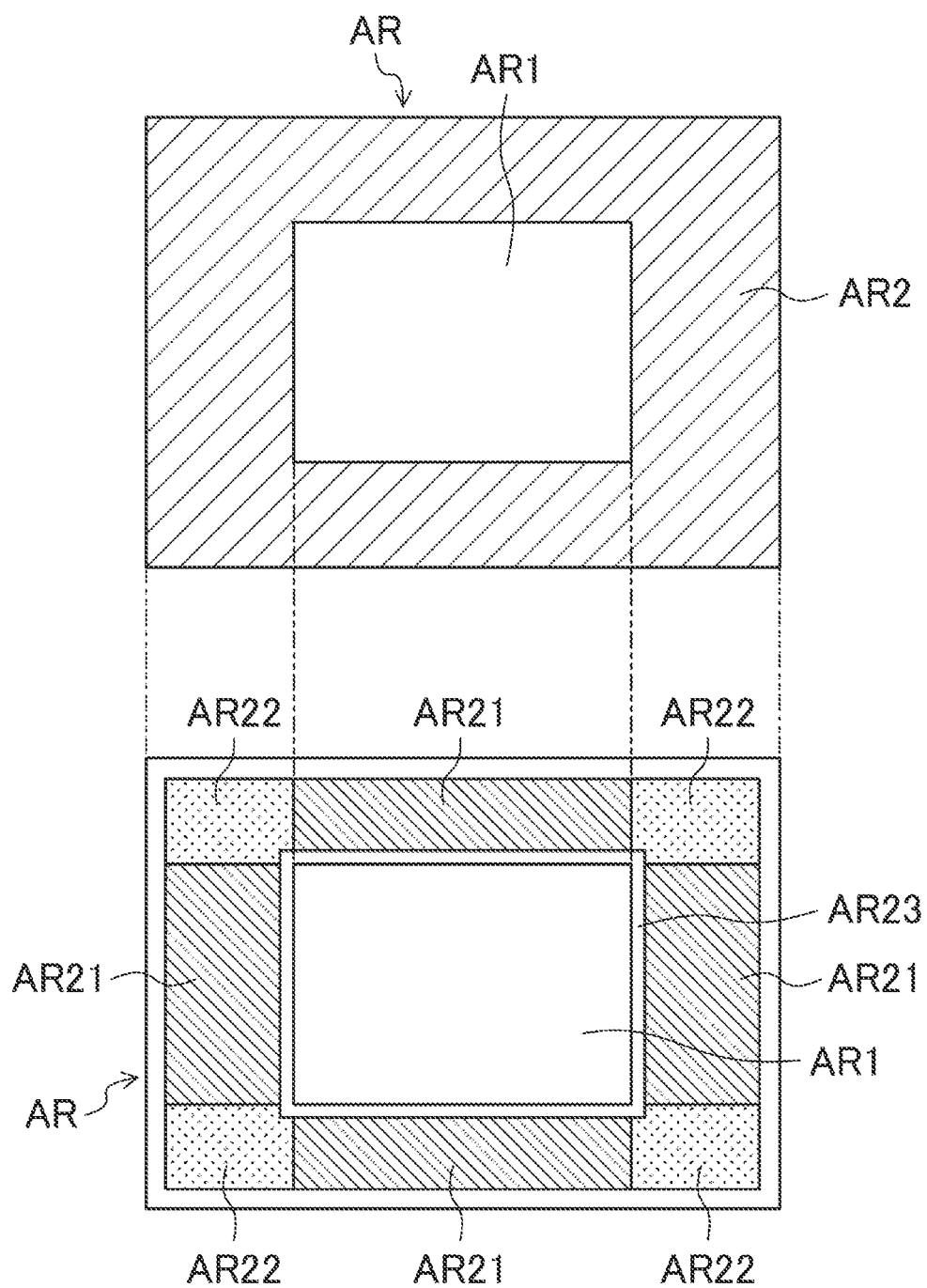

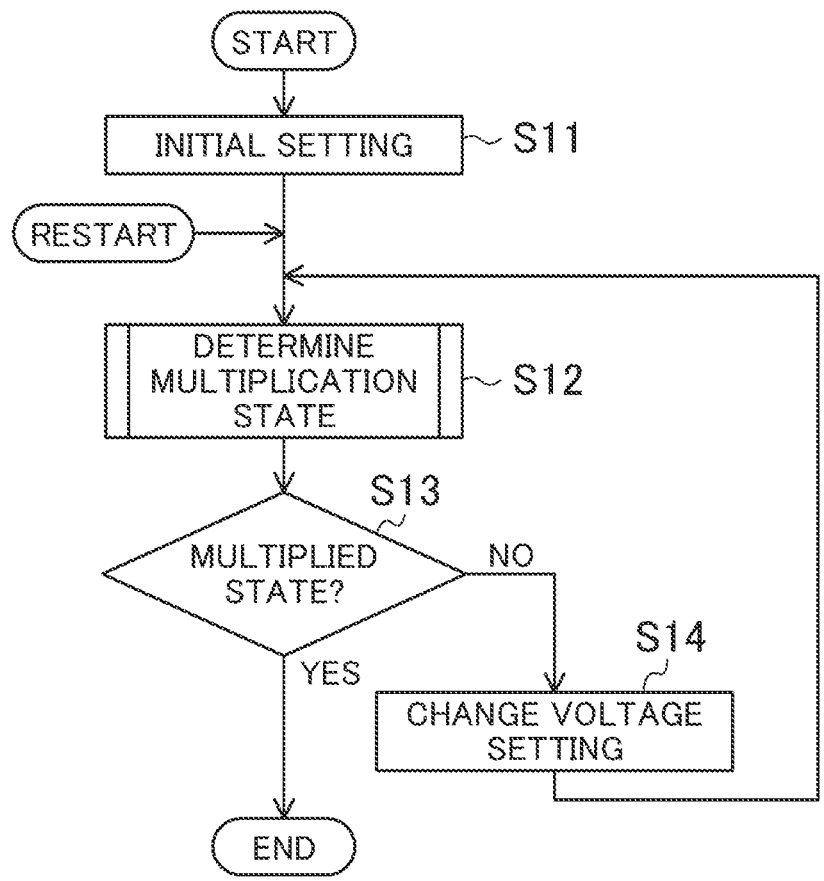

FIG.6
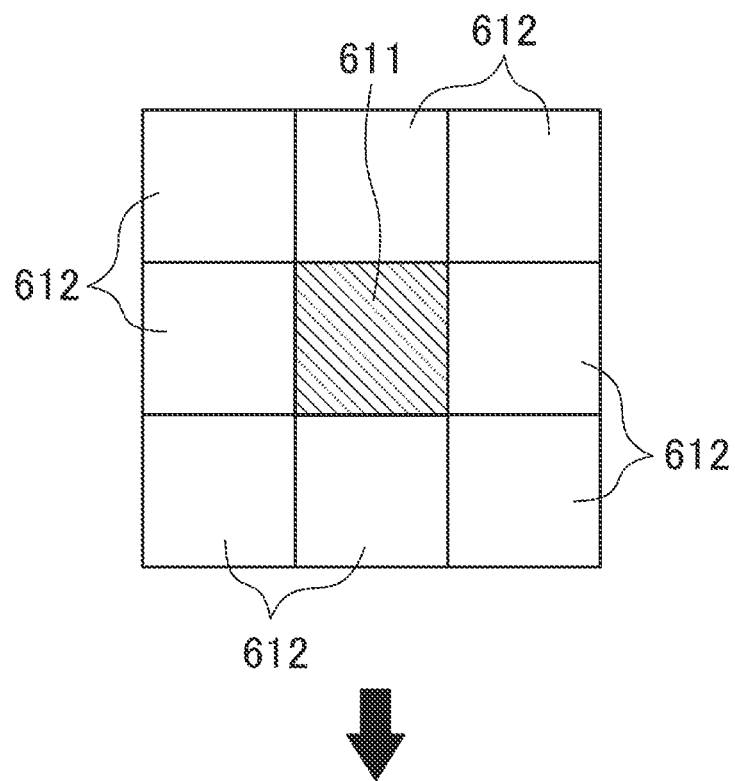
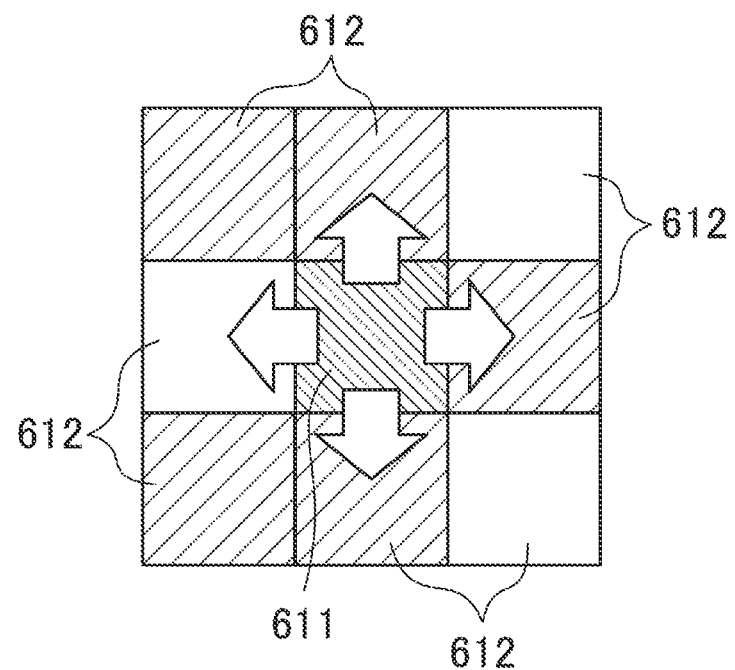

VOLTAGE CONTROL SYSTEM

CROSS-REFERENCE TO RELATED APPLICATIONS

This is a continuation of International Application No. PCT/JP2022/014310 filed on Mar. 25, 2022, which claims priority to Japanese Patent Application No. 2021-061118 filed on Mar. 31, 2021. The entire disclosures of these applications are incorporated by reference herein.

BACKGROUND

The present disclosure relates to a voltage control system that controls a bias voltage to be applied to light receiving elements.

In an avalanche semiconductor light sensor, known is a technology of performing temperature compensation for a bias voltage so as to avoid an influence on the bit error rate of a detected light signal.

For example, Japanese Unexamined Patent Publication No. 2000-171295 (Patent Document 1) describes a technology in which, in a photodetector using an avalanche photodiode (APD), the ambient temperature of the APD is monitored with a temperature sensor and a bias voltage set value to compensate a change of the bias voltage with respect to the ambient temperature is read from a memory means and set.

Also, Japanese Unexamined Patent Publication No. 2011-244076 (Patent Document 2) describes a technology in which the conversion factor of a multiplied image is calculated using a luminance average value and a luminance distribution average value, to determine the electron multiplication factor of the multiplied image using the calculated conversion factor and a conversion factor at a reference electron multiplication factor.

However, Patent Document 1 has a problem of failing to respond to a change with time. Patent Document 2 has a problem that, since the incident light amount must be known in advance, this technology is unavailable for uses in which the incident light amount is not known in advance.

An objective of the present disclosure is supplying a proper bias voltage responsive to the ambient temperature to light receiving elements, without use of illumination for calibration, even when the breakdown voltage for shifting of the light receiving elements to a Geiger mode has changed with time.

SUMMARY

According to one mode of the present disclosure, a voltage control system includes an array unit having a light receiving array part receiving incident light and a light shielding array part shielding the light receiving elements from the incident light by a light shielding mechanism. The voltage control system further includes: a voltage application unit applying a bias voltage to the anode terminal; a multiplication state determination unit determining the multiplication state of the light shielding array part based on output signals from cathodes of the light receiving elements in the light shielding array part; and a voltage setting unit performing voltage setting for the bias voltage to be output from the voltage application unit based on the determination results from the multiplication state determination unit.

According to the present disclosure, it is possible to supply a proper bias voltage responsive to the ambient temperature to light receiving elements, without use of illumination for calibration, even when the breakdown voltage for shifting of the light receiving elements to a Geiger mode has changed with time.

BRIEF DESCRIPTION OF THE DRAWINGS

FIG. 2 is a plan view showing an example of a valid pixel area and a light shielding area.

FIG. 3 is a flowchart showing an operation example of the voltage control system of the first embodiment.

FIG. 6 is a view for explaining yet another example of multiplication determination by the multiplication state determination unit.

DETAILED DESCRIPTION

Embodiments of the present disclosure will be described hereinafter with reference to the accompanying drawings. It is to be noted that the following description of the embodiments is essentially mere illustration and by no means intended to limit the present invention, applications thereof, or uses thereof.

First Embodiment

Figure 1:
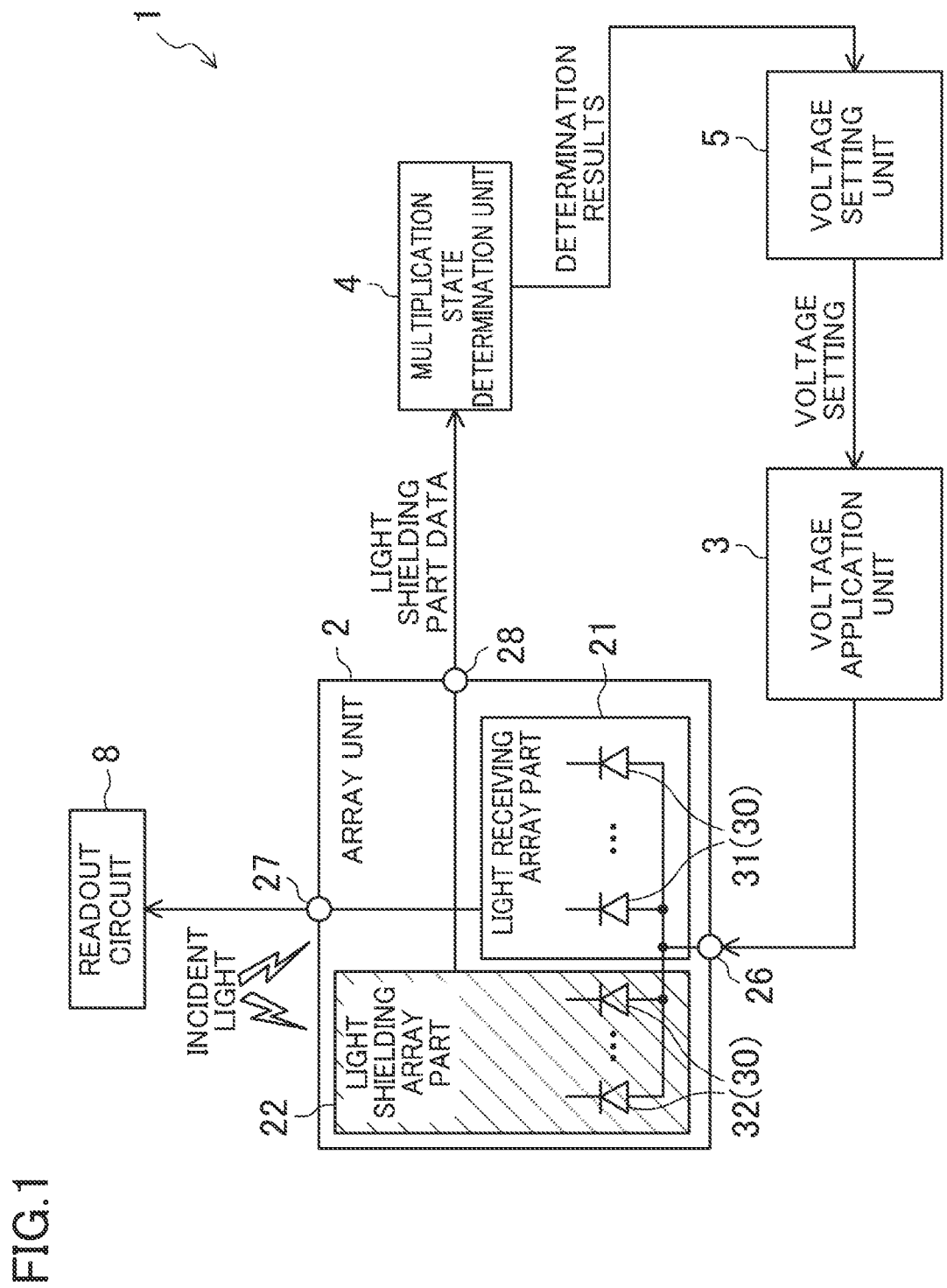
FIG. 1 is a view showing a configuration example of a voltage control system of the first embodiment.

FIG. 1 shows a configuration example of a voltage control system of the first embodiment.

The voltage control system 1 of this embodiment includes an array unit 2 having light receiving elements 30 arranged in an array, a voltage application unit 3, a multiplication state determination unit 4, and a voltage setting unit 5.

—Array Unit—

The array unit 2 includes: a light receiving array part 21 having a plurality of light receiving elements 30 arranged in an array in a valid pixel area AR1; and a light shielding array part 22 having a plurality of light receiving elements 30 arranged in an array in a light shielding area AR2 provided on the same plane as the valid pixel area AR1. FIG. 2 shows a placement example in which the valid pixel area AR1 in a rectangular shape is provided in the center of a rectangular pixel area AR and the light shielding area AR2 is provided to surround the valid pixel area AR1. In the upper part of FIG. 2, the light shielding area AR2 is hatched with diagonally right-up lines. In the example of FIG. 2, the light shielding area includes areas AR21, AR22, and AR23 to be described later.

As used herein, for convenience of description, the light receiving elements 30 placed in the valid pixel area AR1 are referred to as first light receiving elements 31, and the light receiving elements 30 placed in the light shielding area AR2 as second light receiving elements 32. The first light receiving elements 31 and the second light receiving elements 32 have the same configuration. It is however also acceptable for the first light receiving elements 31 and the second light receiving elements 32 to have different configurations from each other.

The valid pixel area AR1 refers to an area configured so that the first light receiving elements 31 placed therein can receive incident light from outside. The light shielding area AR2 refers to an area in which the second light receiving elements 32 placed therein are shielded from light by a light shielding mechanism.

The configuration of the light shielding mechanism is not especially limited, but only required to shield the second light receiving elements 32 placed in the light shielding area from light. Specific examples of the light shielding mechanism include a light shielding film formed to cover the surfaces of the light receiving elements and a light shielding plate configured to cover the surfaces of the second light receiving elements 32.

The shape of the light shielding area AR2 is not limited to that shown in FIG. 2. For example, as shown by the diagonally right-down hatching in FIG. 2, at least one of the areas AR21 on the left, right, top, and bottom sides of the valid pixel area AR1 may be set as the light shielding area AR2. Otherwise, the valid pixel area and the diagonally right-down hatched areas AR21 in FIG. 2 may be set as the valid pixel area AR1, and the dotted areas AR22 at the four corners of the pixel area AR may be set as the light shielding area AR2. Note that, as shown in the lower part of FIG. 2, the area AR23 (e.g., an area with a width of several pixels) of the light shielding area AR2 along the border with the valid pixel area AR1 may be excluded from use for multiplication determination to be described later because light may enter this area due to diffraction from the border of the light shielding mechanism.

Each of the first light receiving elements 31 has a first photoelectric converter that photoelectrically converts incident light received from outside and a PN junction where photoelectrons obtained by the photoelectric conversion by the first photoelectric converter are subjected to signal multiplication.

Each of the second light receiving elements 32 has a second photoelectric converter shielded from light by the light shielding mechanism and a PN junction where noise electrons generated in the second photoelectric converter are subjected to signal multiplication.

Anodes of the first light receiving elements 31 constituting the light receiving array part 21 and anodes of the second light receiving elements 32 constituting the light shielding array part 22 are both connected to a common anode terminal 26. More specifically, the anodes of the first light receiving elements 31 are connected to a common signal line, and the common signal line is connected to the anode terminal 26. Similarly, the anodes of the second light receiving elements 32 are connected to a common signal line, and the common signal line is connected to the anode terminal 26.

Cathodes of the first light receiving elements 31 are individually connected to a readout circuit 8 via a first cathode terminal 27. Cathodes of the second light receiving elements 32 are individually connected to an input of the multiplication state determination unit 4 via a second cathode terminal 28.

Avalanche photodiodes (APD), for example, can be suitably used for the first light receiving elements 31 and the second light receiving elements 32. Hereinafter, description will be made assuming that the first light receiving elements 31 and the second light receiving elements 32 are APDs.

—Voltage Application Unit—

Figure 12:
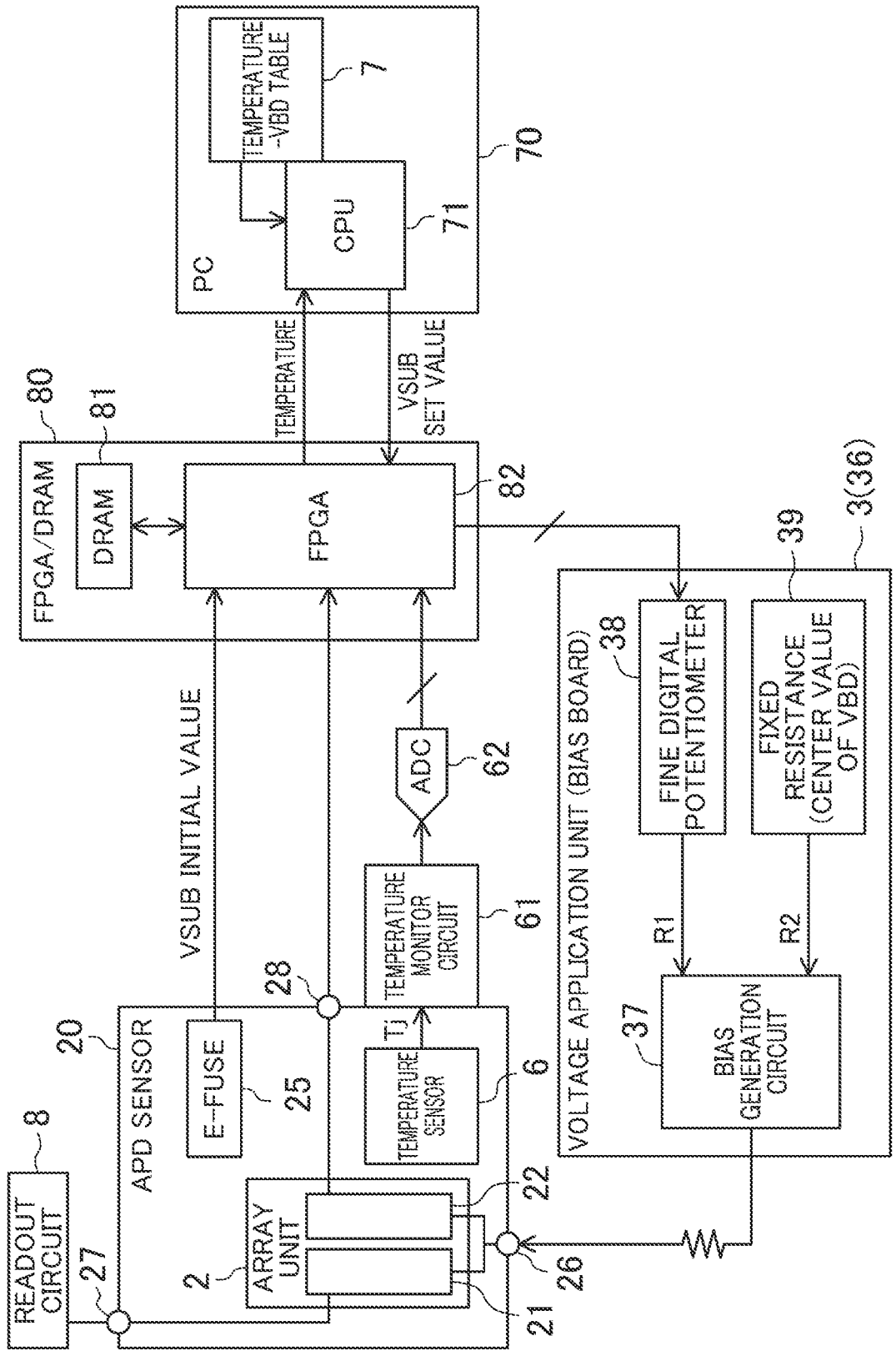
FIG. 12 is a functional block diagram showing an example of introduction of the voltage control system into a real system.

The voltage application unit 3 applies a bias voltage Vsub to the anode terminal 26 of the array unit 2. A conventionally known voltage application circuit can be used as the voltage application unit 3, and its specific configuration is not especially limited. FIG. 12 shows an example of the voltage application unit 3. The voltage application unit 3 shown in FIG. 12 is mounted on a bias board 36 and includes a bias voltage generation circuit 37, a fine digital potentiometer 38, and a fixed resistance 39.

The bias voltage generation circuit 37 outputs the bias voltage Vsub to the anode terminal 26 of the array unit 2 (APDs). The bias voltage generation circuit 37 is configured to output the bias voltage Vsub based on the resistance value of a reference resistance. More specifically, the bias voltage generation circuit 37 is configured to output a predetermined voltage (e.g., −25 [V]) corresponding to a resistance value R2 of the fixed resistance 39 in the initial state, for example.

The fine digital potentiometer 38 has a function of adjusting the bias voltage Vsub to be output from the bias voltage generation circuit 37. Specifically, the fine digital potentiometer 38 sets an adjusted resistance value R1 based on setting information from the voltage setting unit 5, for example. In this way, the bias voltage taking the resistance value R2 of the fixed resistance 39 and the adjusted resistance value R1 into account is output from the bias voltage generation circuit 37.

—Multiplication State Determination Unit—

Referring back to FIG. 1, the multiplication state determination unit 4 determines the multiplication state of the light shielding array part 22 based on an output signal from the second cathode terminal 28 of the array unit 2, i.e., an output signal from the light shielding array part 22. The method of determining the multiplication state by the multiplication state determination unit 4 will be described later presenting a specific example in "Operation of Voltage Control System."

—Voltage Setting Unit—

The voltage setting unit 5 performs voltage setting for the bias voltage to be output from the voltage application unit 3 based on the determination results from the multiplication state determination unit 4.

An APD can multiply an electron obtained by photoelectrically converting a single photon up to a saturated value in a "Geiger mode" in which a voltage equal to or higher than the breakdown voltage is applied. Since a photodiode is easily saturated and noise is also amplified in the Geiger mode, this mode is fit for uses of detecting the presence or absence of light. That is, when the array unit 2 is used as an APD sensor 20 (see FIG. 12), it is preferable to operate the array unit 2 in the "Geiger mode." In view of this, the voltage setting unit 5 performs voltage setting for the bias voltage Vsub to be output from the voltage application unit 3 so that the light receiving elements 30 (especially, the first light receiving elements 31) in the array unit 2 be operated in the Geiger mode.

For example, when the multiplication state determination unit 4 determines that no multiplication is occurring in the light shielding array part 22, the voltage setting unit 5 performs voltage setting so that the absolute value of the bias voltage Vsub to be output from the voltage application unit 3 be greater than that of the previous set voltage based on the determination results from the multiplication state determination unit 4. That is, setting is made so that a higher bias (a bias greater in absolute value) than the previous set voltage be applied. A more specific example will be described in "Operation of Voltage Control System" below.

—Operation of Voltage Control System—

Next, an operation example of the voltage control system 1 of this embodiment will be described with reference to the flowchart of FIG. 3. Note that, in the following description, the state in which a voltage equal to or higher than the breakdown voltage is applied to the APDs as the light receiving elements 30 in the array unit 2 is called the "Geiger mode" and the state in which a voltage lower than the breakdown voltage is applied to the APDs is called the "linear mode."

In step S11, the voltage setting unit 5 sets the initial value of the bias voltage Vsub to be output from the voltage application unit 3. As an initial voltage value Vs1 of the bias voltage Vsub, a voltage at which the APDs are operated in the Geiger mode is set at the inspection in the manufacturing process of the APD sensor 20 (see FIG. 12) equipped with the array unit 2, for example. The initial voltage value Vs1 is thus output to the anode terminal 26 from the voltage application unit 3 as the bias voltage Vsub.

The initial voltage value Vs1 is written in a nonvolatile memory 25 (see FIG. 12) installed in the APD sensor 20 at the time of inspection in the manufacturing process, for example. The configuration of the nonvolatile memory 25 is not especially limited. For example, an e-fuse is used as the nonvolatile memory 25.

In step S12, the multiplication state determination unit 4 determines the multiplication state of the light shielding array part 22 based on the output signal from the second cathode terminal 28. That is, by measuring multiplied noise output from the second light receiving elements 32 in the light shielding area AR2, whether or not signal multiplication is occurring in the noise electrons output from the second light receiving elements 32 (multiplied state or not) is determined.

FIGS. 4A-4B, 5A-5B, 6, and 7A-7B show examples of determination of the multiplication state of the light shielding array part 22 by the multiplication state determination unit 4. First, referring also to FIG. 3, a flow of serial operations by a determination method in FIGS. 4A and 4B will be described.

Figure 4A:
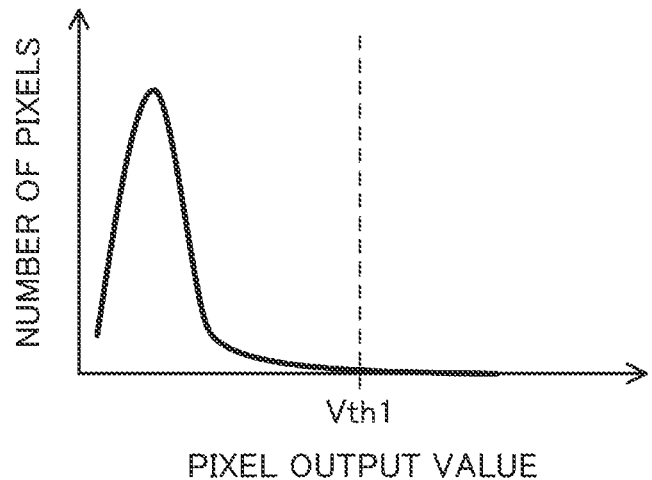
FIG. 4A is a view for explaining an example of multiplication determination (linear mode) by a multiplication state determination unit.
Figure 4B:
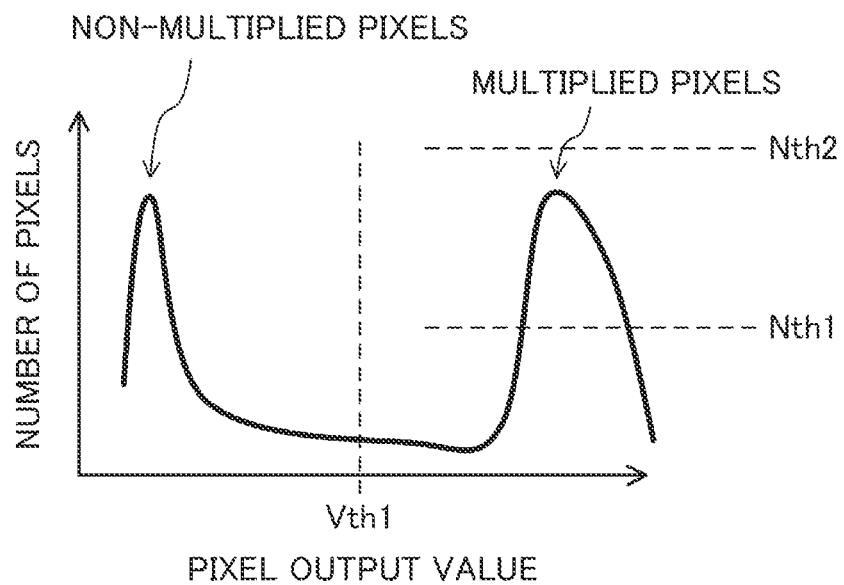
FIG. 4B is a view for explaining an example of multiplication determination (Geiger mode) by the multiplication state determination unit.

FIGS. 4A and 4B show examples of histograms with the pixel output value in the light shielding array part 22 as the x-axis and the number of pixels having each pixel output value as the y-axis. In FIGS. 4A and 4B, the y-axis is presented in a logarithmic scale.

In the linear mode, a dark current (noise electrons) generated in the second light receiving elements 32 in the light shielding array part 22 is not multiplied. Therefore, as shown in FIG. 4A, the histogram is such that the number of pixels concentrates on low pixel output values.

By contrast, in the Geiger mode, since charges (noise electrons) generated in the second light receiving elements 32 in the light shielding array part 22 are multiplied, a dark current corresponding to this signal multiplication occurs. Therefore, as shown in FIG. 4B, the histogram is such that the second light receiving elements 32 are grouped into two, i.e., pixels large in pixel output value by being multiplied and pixels small in pixel output value without occurrence of a dark current (without being multiplied).

From the above, the multiplication state determination unit 4 determines that the state is the Geiger mode when the number of pixels having a pixel output value equal to or greater than a predetermined threshold Vth1 is equal to or greater than a predetermined threshold Nth1. As a result, the determination is YES in step S13 in FIG. 3, and the voltage setting unit 5 maintains the previous set value.

On the other hand, the multiplication state determination unit 4 determines that the state is the linear mode when the number of pixels having a pixel output value equal to or greater than the predetermined threshold Vth1 is smaller than the predetermined threshold Nth1. As a result, the determination is NO in step S13 in FIG. 3, and the flow proceeds to next step S14.

In step S14, the voltage setting unit 5 changes the setting of the voltage to be output to the voltage application unit 3 based on the determination results from the multiplication state determination unit 4. In this example, the voltage setting unit 5 outputs a voltage Vs2 obtained by adding a predetermined voltage to the bias voltage Vsub at that time (the initial voltage value Vs1 in the case of the initial state) as the set value of the bias voltage Vsub. That is, the voltage is set so as to be greater in absolute value than the previous set voltage.

Thereafter, the flow returns to step S12 to repeat the processing of steps S12 through S14 until it is determined that the light shielding array part 22 is operating in the Geiger mode. In other words, the processing of increasing the bias voltage Vsub (increasing the absolute value) is executed until the number of pixels having a pixel output value equal to or greater than the predetermined threshold Vth1 becomes equal to or greater than the predetermined threshold Nth1. Once it is determined that the light shielding array part 22 is operating in the Geiger mode and the determination is YES in step S13, the bias voltage Vsub at the time of this determination is used, and the processing is terminated.

In the voltage control system, the series of processing steps in FIG. 3 described above is executed at predetermined intervals (e.g., at intervals of several seconds). Note that, at a restart of the processing after a lapse of a predetermined time, the processing at and after step S12 is executed using the set voltage set in the previous processing. That is, in the restarted processing, the processing at and after step S12 is executed using the set voltage at which it has been determined immediately before that multiplication occurs.

Note that, when the multiplication state determination unit 4 determines the multiplication state of the light shielding array part 22 in step S12, the determination may be YES in step S13 when the number of pixels having a pixel output value equal to or greater than the predetermined threshold Vth1 is within a predetermined range between the predetermined threshold Nth1 and a predetermined threshold Nth2 (Nth1<Nth2) inclusive. In this case, when the number of pixels having a pixel output value equal to or greater than the predetermined threshold Vth1 is greater than the threshold Nth2, the multiplication state determination unit 4 determines that the state is an "excessive bias mode" in which the bias voltage is excessively great, and the determination is NO in step S13. In next step S14, the voltage setting unit 5 changes the voltage setting based on the determination results from the multiplication state determination unit 4. Specifically, the voltage setting unit 5 outputs a voltage Vs3 obtained by subtracting a predetermined voltage from the bias voltage Vsub at that time as the set value of the bias voltage Vsub. That is, the voltage is set so as to be smaller in absolute value than the previous set voltage.

Other examples of determination of the multiplication state of the light shielding array part 22 by the multiplication state determination unit 4 will be described hereinafter with reference to FIGS. 5A-5B, 6, and 7A-7B.

Another Determination Example (1)

Described here is an example of determining the multiplication state by executing light exposure a predetermined number of times (e.g., N times) and summing the pixel output values of the predetermined number of times for each pixel, to determine the multiplication state based on the summed value.

Figure 5A:
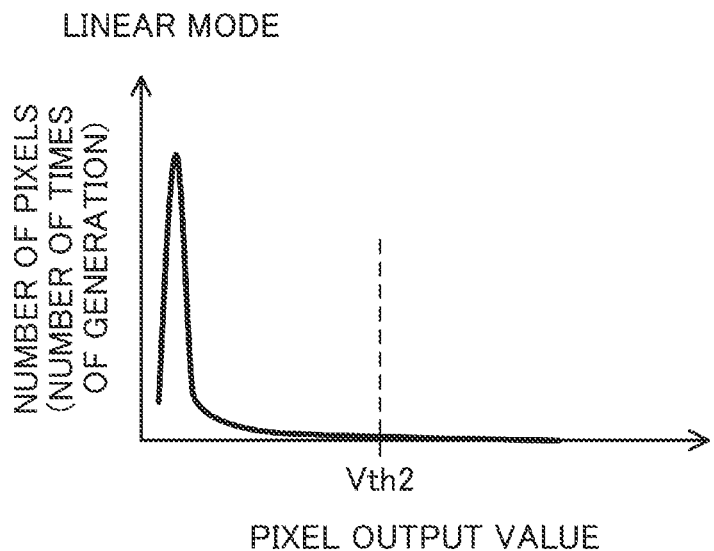
FIG. 5A is a view for explaining another example of multiplication determination (linear mode) by the multiplication state determination unit.
Figure 5B:
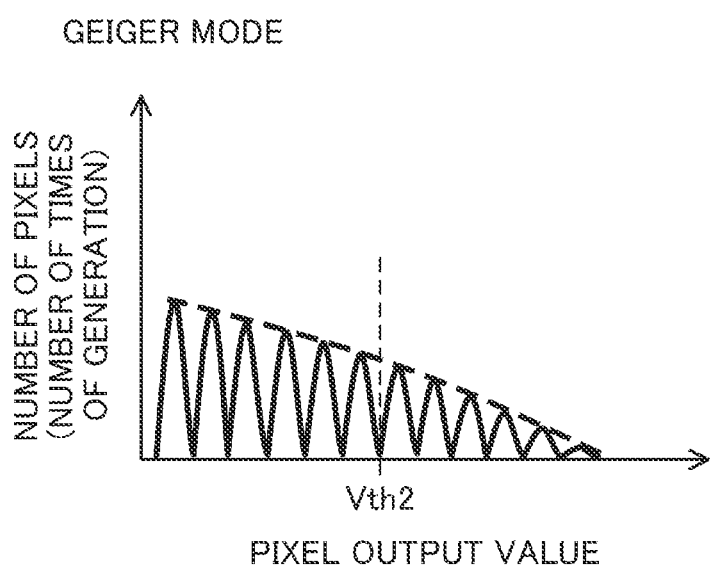
FIG. 5B is a view for explaining another example of multiplication determination (Geiger mode) by the multiplication state determination unit.
Figure 7A:
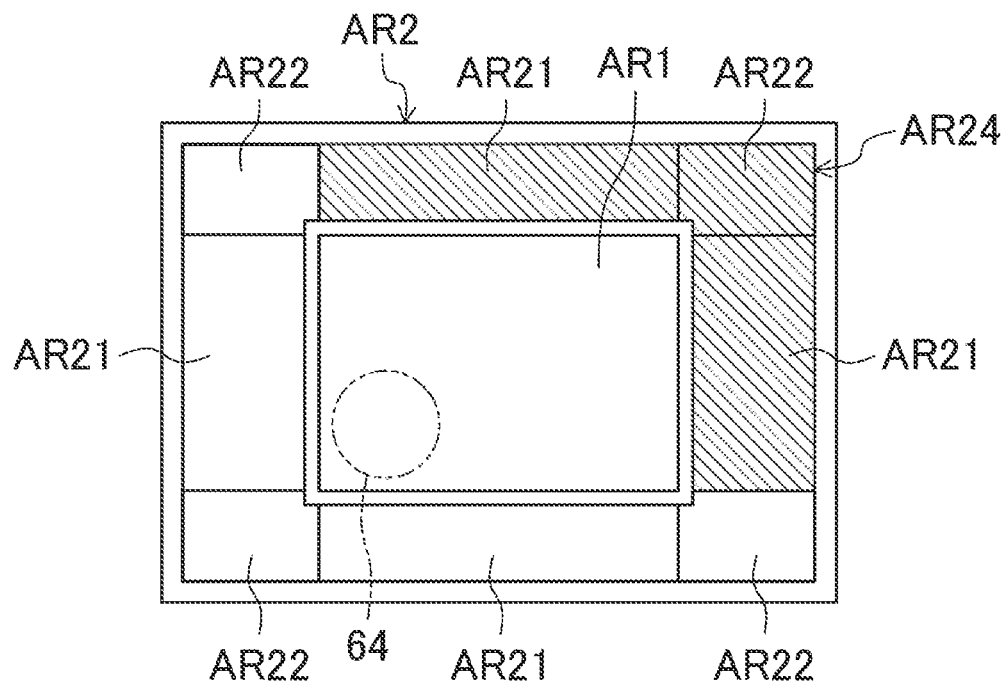
FIG. 7A is a view for explaining yet another example of multiplication determination by the multiplication state determination unit.
Figure 7B:
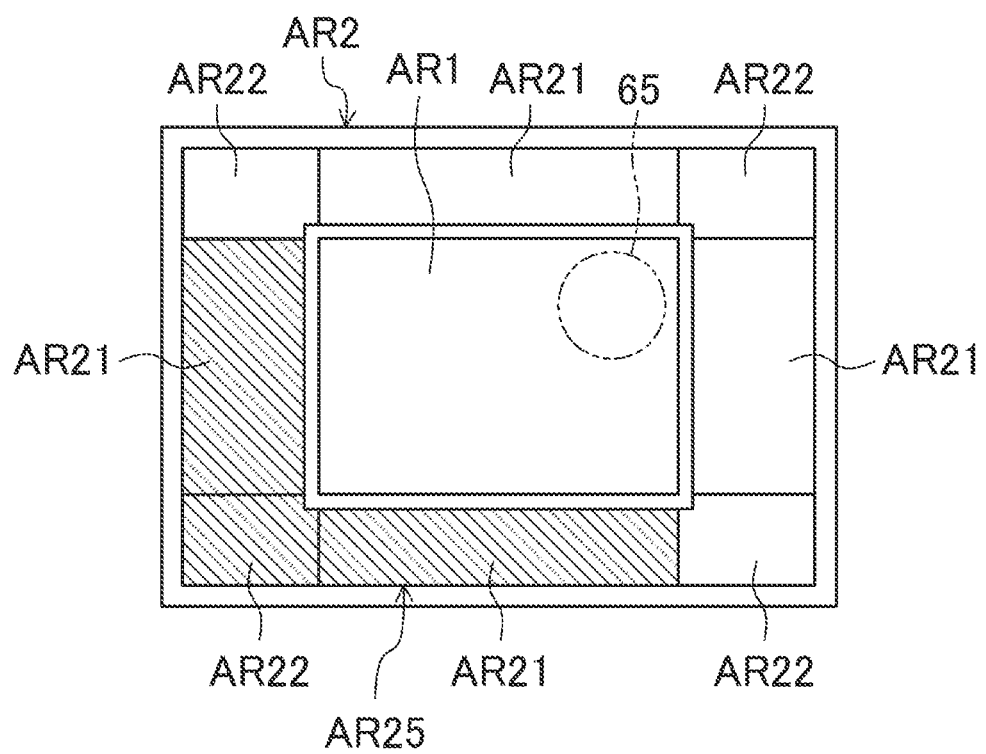
FIG. 7B is a view for explaining yet another example of multiplication determination by the multiplication state determination unit.

FIGS. 5A and 5B show examples of histograms with the summed pixel output value in the light shielding array part 22 as the x-axis and the number of pixels having each pixel output value as the y-axis. In FIGS. 5A and 5B, the y-axis is presented in a logarithmic scale.

As described earlier, in the linear mode, since a dark current (noise electrons) generated in the second light receiving elements 32 in the light shielding array part 22 is not multiplied, the number of generated charges is small. Therefore, as shown in FIG. 5A, the histogram is such that the number of pixels (number of times of generation) concentrates on low pixel output values.

By contrast, in the Geiger mode, a dark count occurs with a fixed probability p for each time of light exposure. For example, when light is exposed N times, the probability Pn of detecting a dark count n times per pixel is expressed by Equation (1):

$$Pn = p^n \times (1-p)^{(N-n)} \times {}_N C_n \quad (1)$$

As a result, in the Geiger mode, there is a distribution due to count-by-count variations as shown in FIG. 5B, presenting a histogram in which an extrapolation line of peaks of the distribution of the counts is as shown by the broken line.

In view of the above, in step S12 in FIG. 3, the multiplication state determination unit 4 determines whether or not the number of pixels (the number of times of generation) having a pixel output value equal to or greater than a predetermined threshold Vth2 is equal to or greater than a predetermined threshold Ith, and, if so, the determination is YES. On the other hand, when the number of pixels (the number of times of generation) having a pixel output value equal to or greater than the predetermined threshold Vth2 is smaller than the predetermined threshold Ith, the determination is NO. The other processing is similar to that described above using FIGS. 3, 4A, and 4B, and similar effects can be obtained.

Note that where to execute the summation is not especially limited. The summation may be executed inside the APD sensor 20 (see FIG. 12), or may be executed in the multiplication state determination unit 4.

Another Determination Example (2)

Described here is an example of determining the multiplication state based on the pattern of pixels including a light receiving element in which multiplication is occurring (hereinafter such pixels are referred to as multiplied pixels).

As shown in the upper part of FIG. 6, when a dark count and multiplication have occurred in a given pixel 611, multiplying electrons proceed slantly in the depth direction of the light receiving element 30 causing back reflection, whereby multiplication occurs in adjacent pixels 612 or pixels several pixels away from the pixel 611.

In view of the above, in step S12 in FIG. 3, the multiplication state determination unit 4 determines that the light shielding array part 22 is in the multiplied state when either of the following patterns (1) and (2) has occurred, for example. That is, (1) when multiplied pixels have appeared in a cluster of several pixels and/or (2) when a multiplied pixel has appeared several pixels away from a given multiplied pixel, the multiplication state determination unit 4 determines that the light shielding array part 22 is in the multiplied state, and the determination is YES in step S13 in FIG. 3. The other processing is similar to that described above using FIGS. 3, 4A, and 4B, and similar effects can be obtained.

As described above, the voltage control system 1 of this embodiment is configured to include: the light receiving array part 21 having the first light receiving elements 31 arranged in an array, each of the first light receiving elements 31 having the first photoelectric converter photoelectrically converting received incident light and the PN junction where photoelectrons obtained from the photoelectric conversion by the first photoelectric converter are subjected to signal multiplication; the light shielding array part 22 having the second light receiving elements 32 arranged in an array, each of the second light receiving elements 32 having the second photoelectric converter shielded from light by a light shielding mechanism and the PN junction where noise electrons generated in the second photoelectric converter are subjected to signal multiplication; the voltage application unit 3 that applies the bias voltage Vsub to the anode terminal 26 to which the anodes of the first light receiving elements 31 in the light receiving array part 21 and the anodes of the second light receiving elements 32 in the light shielding array part 22 are both connected; the multiplication state determination unit 4 that determines the multiplication state based on the output signals from the cathodes of the second light receiving elements 32 in the light shielding array part 22; and the voltage setting unit 5 that performs voltage setting for the bias voltage Vsub to be output from the voltage application unit 3 based on the determination results from the multiplication state determination unit 4.

As described above, the light shielding array part 22 is provided, and voltage setting of the bias voltage Vsub is performed based on the multiplication state of noise electrons generated in the second photoelectric converters of the second light receiving elements 32 in the light shielding array part 22. With this, even when the breakdown voltage used for shifting of the light receiving elements to the Geiger mode changes with time, the bias voltage Vsub responsive to such a change with time can be applied to the anode terminal 26. Also, in the setting of the bias voltage Vsub responsive to a change with time, it is unnecessary to use illumination for calibration.

The light exposure time may be adjusted depending on the occurrence frequency of noise electrons generated in the second photoelectric converters of the second light receiving elements 32 in the light shielding array part 22. For example, when the light exposure time is set at a time during which one noise electron is generated stochastically for each pixel of the photoelectric converter, the rate of the multiplied pixels in the histogram of FIG. 4B will be the multiplication probability of the photoelectric converter.

The light shielding area AR2 used in the above multiplication determination methods may be changed based on the multiplication state of the valid pixel area AR1. For example, when multiplication is occurring in a predetermined number of pixels or more in a specific region of the valid pixel area AR1, multiplication may become difficult in pixels near such a region because the bias conditions fluctuate. Therefore, when multiplication is occurring in a predetermined number of pixels or more in a specific region of the valid pixel area AR1, a portion of the light shielding area AR2 located away from such a region by a predetermined distance or longer is used for multiplication determination. For example, when multiplication is occurring in a predetermined number of pixels or more in a region 64 in FIG. 7A or a region in FIG. 7B, a portion of the light shielding area AR2 located away from the region 64 or 65 (see a hatched area AR24 in FIG. 7A or a hatched area AR25 in FIG. 7B) is used for multiplication determination.

Note that the multiplication state determination methods described above may be executed singly, or the multiplication state may be determined comprehensively using a plurality of multiplication state determination methods.

Second Embodiment

Figure 8:
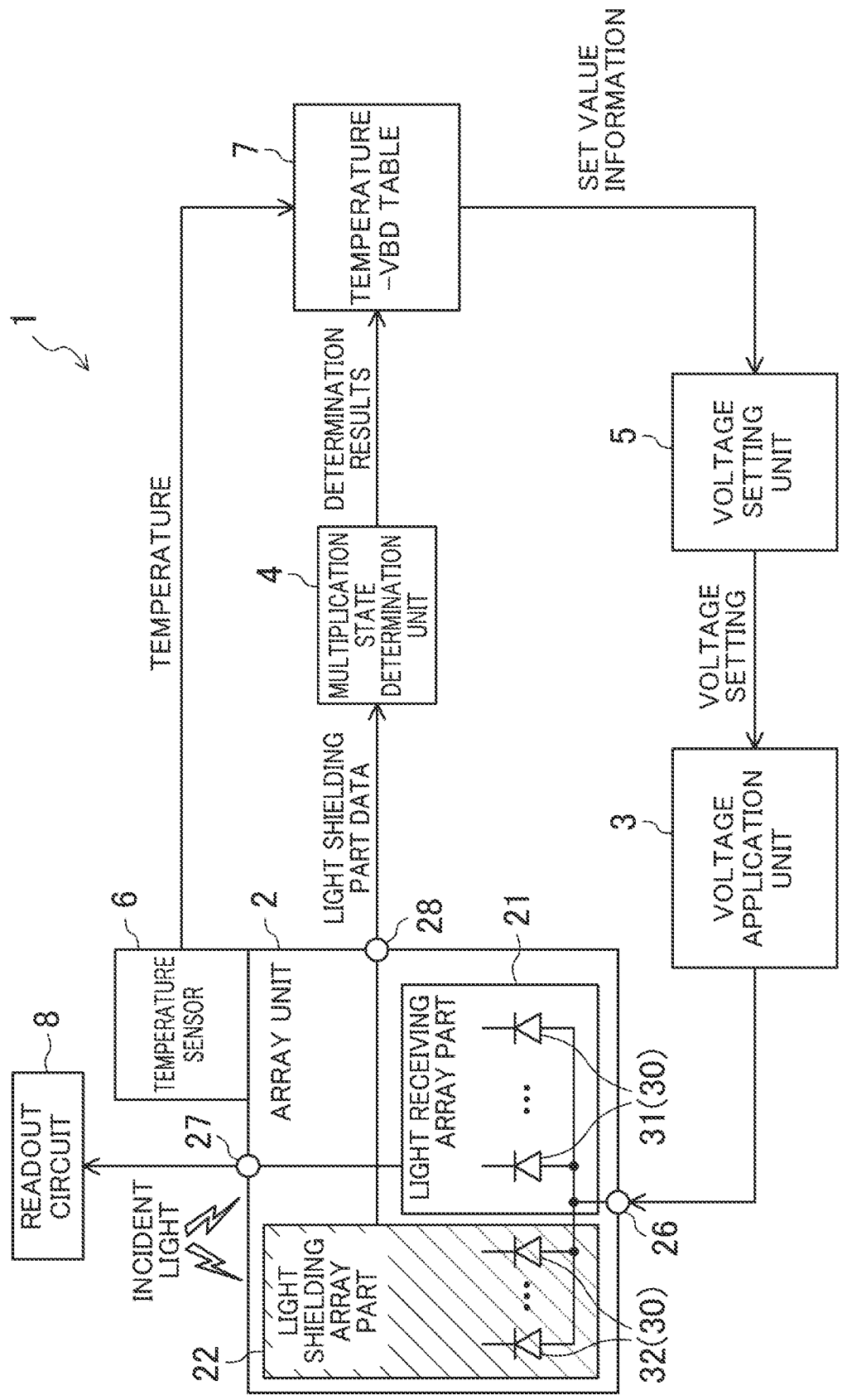
FIG. 8 is a view showing a configuration example of a voltage control system of the second embodiment.

FIG. 8 shows a configuration example of a voltage control system 1 of the second embodiment.

The voltage control system 1 of this embodiment includes an array unit 2 having light receiving elements 30 arranged in an array, a voltage application unit 3, a multiplication state determination unit 4, a voltage setting unit 5, a temperature sensor 6, and a temperature-voltage table 7. Note that the following description of the voltage control system 1 will be made centering on differences from the first embodiment.

The voltage control system 1 of this embodiment is different from that of the first embodiment in that the temperature sensor 6 and the temperature-voltage table 7 are provided.

—Temperature Sensor—

The temperature sensor 6 measures the ambient temperature of the light receiving array part 21 and the light shielding array part 22.

Figure 9:
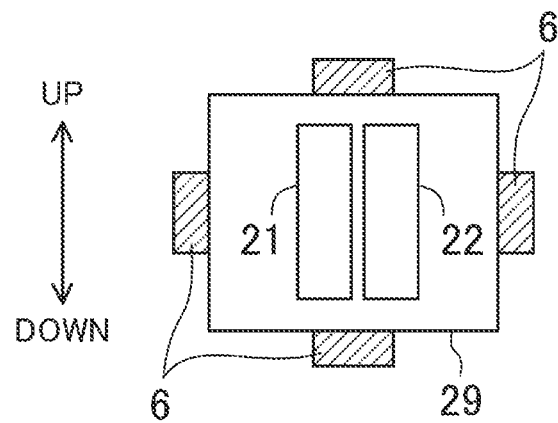
FIG. 9 is a view showing a placement example of a temperature sensor.
Figure 10A:
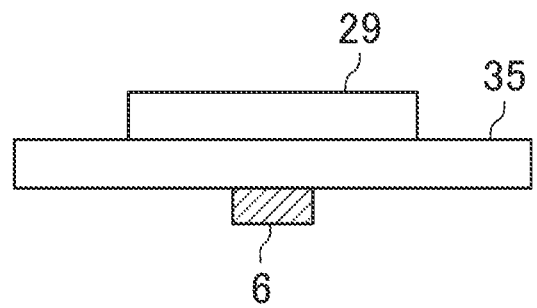
FIG. 10A is a view showing another placement example of the temperature sensor.
Figure 10B:
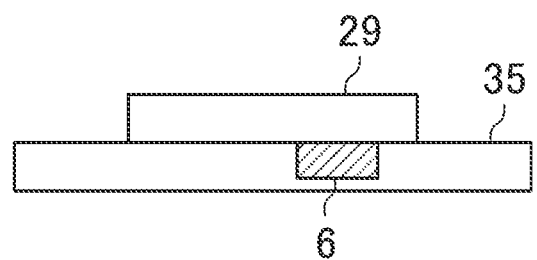
FIG. 10B is a view showing yet another placement example of the temperature sensor.

FIGS. 9, 10A, and 10B show examples of placement of the temperature sensor 6. It is herein assumed that the light receiving array part 21 and the light shielding array part 22 are housed in a sensor package 29 of the APD sensor 20 (see FIG. 12).

In FIG. 9, the temperature sensor 6 is placed to be close to any of the sidewalls of the sensor package 29. On which side of the sensor package 29 the temperature sensor 6 should be placed is not especially limited. For example, since convection of the surrounding air is also influential at the time of thermal conduction from the surrounding air to the APD sensor it is desirable to place the temperature sensor 6 close to a sidewall in the vertical direction (the up-and-down direction in the figure) of the sensor package 29. On the other hand, when the air flows in the horizontal direction (the lateral direction in the figure) depending on the environments where the APD sensor 20 is placed, it is desirable to place the temperature sensor 6 close to a horizontal sidewall of the sensor package 29.

Also, as shown in FIGS. 10A and 10B, when the sensor package 29 is mounted on a printed board 35, the temperature sensor 6 may be placed on the rear face of the printed board 35 opposite to the face on which the sensor package 29 is placed (see FIG. 10A). Otherwise, the temperature sensor 6 may be buried in the printed board 35 to be placed on the rear face of the sensor package 29 (see FIG. 10B).

The temperature sensor 6 used in FIGS. 9, 10A, and 10B is not especially limited, but a conventionally known thermistor, for example, can be suitably used. By placing the temperature sensor 6 close to the sensor package 29 in this way, mounting of the temperature sensor 6 is easy. Also, it is unnecessary to consider an influence of the temperature sensor 6 at the designing of the array unit 2.

As shown in FIG. 12, the temperature sensor 6 may be incorporated in the sensor package 29. That is, the temperature sensor 6 may be provided inside the sensor package 29. Providing the temperature sensor 6 inside the sensor package 29 as used herein refers to a concept including both cases of (1) providing the temperature sensor 6 inside the sensor package 29 and inside a sensor chip (not shown) in which the APD sensor 20 is mounted and (2) providing the temperature sensor 6 inside the sensor package 29 but outside the sensor chip. For example, when the temperature sensor 6 is to be provided inside the sensor chip, a circuit for temperature measurement responsive to the sensor chip is to be designed and incorporated, as in the case of other semiconductor circuits.

By incorporating the temperature sensor 6 in the sensor package 29 as described above, the temperature sensor 6 can be provided at a position closer to the array unit 2, whereby a measured value near the actual temperature of the array unit 2 can be obtained.

—Temperature-Voltage Table—

Set values of the bias voltage Vsub each associated with each measured temperature are stored in the temperature-voltage table 7. The temperature-voltage table 7 receives the measured temperature by the temperature sensor 6, reads out the set value information of the bias voltage Vsub corresponding to the measured temperature, and outputs the results to the voltage setting unit 5.

For example, the nonvolatile memory 25 is installed in the APD sensor 20 (see FIG. 12). In the nonvolatile memory 25, a voltage at which operation is made in the Geiger mode at each measured temperature is written as the initial setting information of the temperature-voltage table 7 at the time of inspection in the manufacturing process. The configuration of the nonvolatile memory 25 is not especially limited. For example, an e-fuse is used as the nonvolatile memory 25.

—Multiplication state determination Unit—

The multiplication state determination unit 4 determines the multiplication state of the light shielding array part 22 based on the output signal from the second cathode terminal 28 of the array unit 2, i.e., the output signal from the light shielding array part 22. The method of determining the multiplication state by the multiplication state determination unit 4 is similar to that described in the first embodiment. In addition, in this embodiment, the multiplication state determination unit 4 updates the temperature-voltage table 7 based on the determination results of the multiplication state of the light shielding array part 22. A specific example will be described later in "Operation of Voltage Control System."

—Voltage Setting Unit—

In this embodiment, the voltage setting unit 5 performs voltage setting for the bias voltage Vsub to be output from the voltage application unit 3 based on the set value information output from the temperature-voltage table 7. A specific example of voltage setting will be described in "Operation of Voltage Control System" below.

—Operation of Voltage Control System—

Next, an operation example of the voltage control system 1 of this embodiment will be described with reference to FIG. 11. Note that the following description will be made centering on differences from the first embodiment.

In step S21, the voltage setting unit 5 sets the bias voltage Vsub to be output from the voltage application unit 3 based on the set value information output from the temperature-voltage table 7. The temperature-voltage table 7 has previously read out the initial setting information described above from the nonvolatile memory 25, for example. An initial voltage value Vs4 based on the initial setting information is thus output to the anode terminal 26 from the voltage application unit 3 as the bias voltage Vsub.

In step S22, the multiplication state determination unit 4 determines the multiplication state of the light shielding array part 22 based on the output signal from the second cathode terminal 28. More specifically, by measuring the multiplied noise output from the second light receiving elements 32 in the light shielding area AR2, whether or not signal multiplication is occurring in the noise electrons output from the second light receiving elements 32 (multiplied state or not), that is, whether or not the operation is in the Geiger mode is determined. The method of determining the multiplication state is similar to that in the first embodiment, and thus detailed description is omitted here.

When the multiplication state determination unit 4 determines that the light shielding array part 22 is operating in the Geiger mode (YES in step S23), the bias voltage Vsub at the time of this determination is used, and the processing is terminated.

On the other hand, when the multiplication state determination unit 4 determines that the light shielding array part 22 is operating in the linear mode, not the Geiger mode (NO in step S23), the flow proceeds to next step S24.

In step S24, the multiplication state determination unit 4 updates the voltage setting information of the temperature-voltage table 7 based on the determination results of the multiplication state. Specifically, the set value information of the bias voltage Vsub corresponding to the measured temperature from the temperature sensor 6 is undated so that the absolute value of the set voltage be greater than the previous value. That is, the set value is updated so that a higher bias (a bias greater in absolute value) than the previous set voltage be applied. When the set value information is updated, the flow returns to step S21.

In step S21, the voltage setting unit 5 sets the bias voltage Vsub to be output from the voltage application unit 3 based on the set value information output from the temperature-voltage table 7. Since the updated set value information is output here, a voltage Vs5 (Vs5>Vs4) based on the updated set value information is output if the measured temperature is constant. If the measured temperature from the temperature sensor 6 has changed, the bias voltage Vsub based on the new measured temperature is set and output.

The processing from step S21 through step S24 is repeated in this way until it is determined that the light shielding array part 22 is operating in the Geiger mode. Once it is determined that the light shielding array part 22 is operating in the Geiger mode and the determination is YES in step S23, the bias voltage Vsub at the time of this determination is used, and the processing is terminated.

Figure 11:
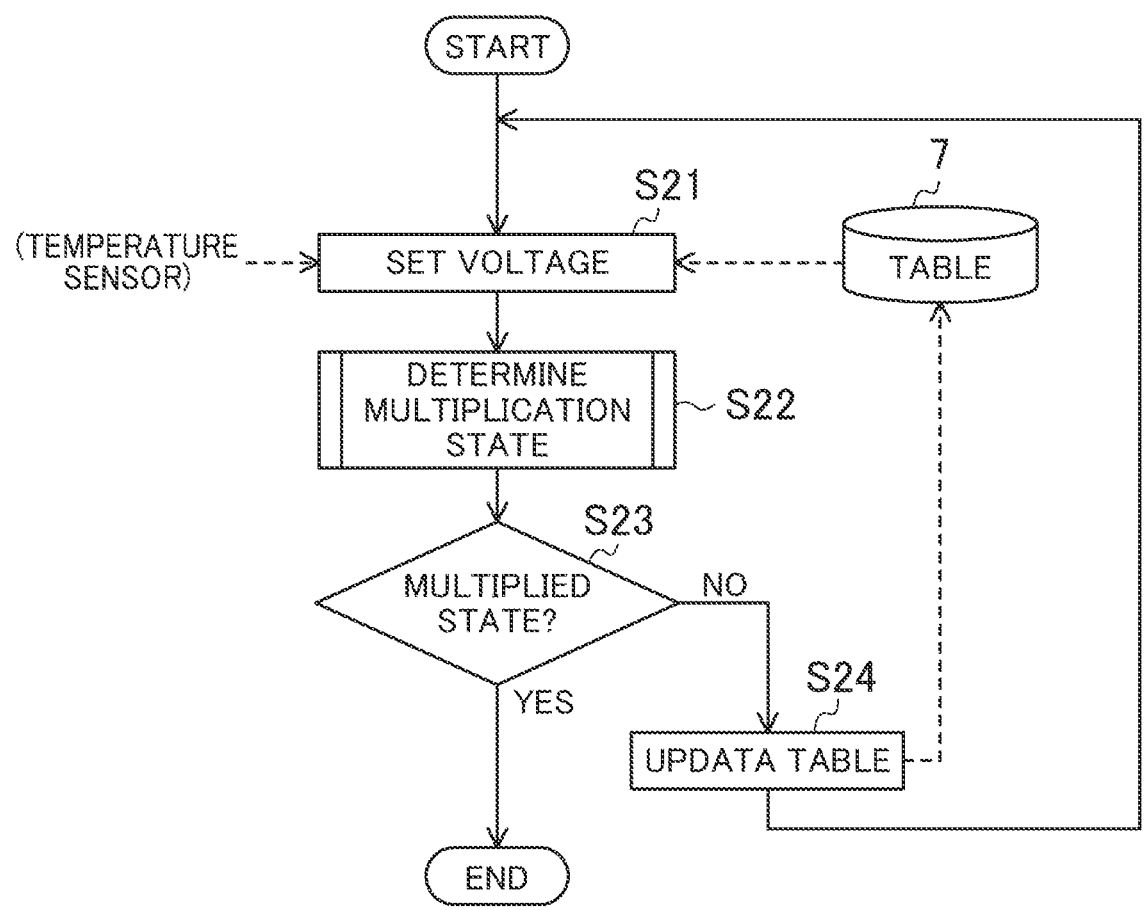
FIG. 11 is a flowchart showing an operation example of the voltage control system of the second embodiment.

In the voltage control system 1, the series of processing steps in FIG. 11 described above is executed at predetermined intervals (e.g., at intervals of several seconds).

Note that, in this embodiment, as in the first embodiment, there may be an operation to be executed when the multiplication state determination unit 4 determines that the state is the "excessive bias mode." For example, in this embodiment, when it is determined that the multiplication state is the "excessive bias mode," the multiplication state determination unit 4 performs, in step S24, voltage setting so that the set value information of the bias voltage Vsub corresponding to the measured temperature from the temperature sensor 6 be smaller in absolute value than the previous set voltage. That is, the set value is updated so that a lower bias (a bias smaller in absolute value) than the previous set voltage be applied.

As described above, the voltage control system 1 of this embodiment is configured to include: the light receiving array part 21 having the first light receiving elements 31 arranged in an array, each of the first light receiving elements 31 having the first photoelectric converter photoelectrically converting received light and the PN junction where photoelectrons obtained from the photoelectric conversion by the first photoelectric converter are subjected to signal multiplication; the light shielding array part 22 having the second light receiving elements 32 arranged in an array, each of the second light receiving elements 32 having the second photoelectric converter shielded from light by a light shielding mechanism and the PN junction where noise electrons generated in the second photoelectric converter are subjected to signal multiplication; the voltage application unit 3 that applies a bias voltage to the anode terminal 26 to which the anodes of the first light receiving elements 31 in the light receiving array part 21 and the anodes of the second light receiving elements 32 in the light shielding array part 22 are both connected; the temperature sensor 6 that measures the ambient temperature of the light receiving array part 21 and the light shielding array part 22; the temperature-voltage table 7 that has a set value of the predetermined bias voltage Vsub associated with each measured temperature and outputs set value information of the bias voltage Vsub corresponding to the measured temperature by the temperature sensor 6; the multiplication state determination unit 4 that determines the multiplication state based on the output signals from the cathodes of the second light receiving elements 32 in the light shielding array part 22 and updates the temperature-voltage table 7 based on the determination results; and the voltage setting unit 5 that performs voltage setting for the bias voltage Vsub to be output from the voltage application unit 3 based on the set value information output from the temperature-voltage table 7.

In this embodiment, the temperature-voltage table 7 is updated based on the determination results of the multiplication state of the light shielding array part 22 by the multiplication state determination unit 4, and voltage setting for the bias voltage Vsub is performed based on the updated information. With this, as in the first embodiment, even when the breakdown voltage used for shifting of the light receiving elements to the Geiger mode changes with time, the bias voltage Vsub responsive to such a change with time can be applied to the anode terminal 26. Also, in the setting of the bias voltage Vsub responsive to a change with time, it is unnecessary to use illumination for calibration.

(Example of Introduction into Real System)

FIG. 12 shows an example of introduction of the voltage control system into a real system.

As shown in FIG. 12, the voltage control system 1 includes: the APD sensor 20 equipped with the array unit 2, the nonvolatile memory 25 (e-fuse), and the temperature sensor 6; an FPGA 82; a computer 70; and the bias board equipped with the voltage application unit 3.

The functions of the multiplication state determination unit 4 and the voltage setting unit 5 may be implemented by the FPGA 82, or else by the computer 70. FIG. 12 shows an example in which the temperature-voltage table 7 is stored in the computer 70 and the functions of the multiplication state determination unit 4 and the voltage setting unit 5 are implemented by a CPU 71 of the computer 70. In this case, the FPGA 82 functions as an interface device among the APD sensor 20, the computer 70, and the bias board (voltage application unit 3).

Since the voltage control system according to the present invention is capable of supplying a proper bias voltage responsive to the ambient temperature to the light receiving elements without use of illumination for calibration even at the occurrence of a change with time, it is highly useful as a voltage control system that controls the bias voltage to be applied to the light receiving elements.

What is claimed is:

1. A voltage control system including an array unit in which a plurality of light receiving elements are arranged and connected to a common anode terminal,
   the array unit having a light receiving array part receiving incident light and a light shielding array part shielding the light receiving elements from the incident light by a light shielding mechanism, the voltage control system comprising:
   a voltage application unit applying a bias voltage to the anode terminal;
   a multiplication state determination unit determining the multiplication state of the light shielding array part based on output signals from cathodes of the light receiving elements in the light shielding array part; and
   a voltage setting unit performing voltage setting for the bias voltage to be output from the voltage application unit based on the determination results from the multiplication state determination unit,
   wherein
   the multiplication state determination unit determines that the light shielding array part is in a multiplied state when the number of light receiving elements in the light shielding array part outputting an output signal equal to or greater than a predetermined first threshold is equal to or greater than a predetermined second threshold, and
   when the multiplication state determination unit does not determine that the light shielding array part is in the multiplied state, the voltage setting unit sets a set value of the bias voltage to be greater in absolute value than the previous set voltage.

2. A voltage control system including an array unit in which a plurality of light receiving elements are arranged and connected to a common anode terminal,
   the array unit having a light receiving array part receiving incident light and a light shielding array part shielding the light receiving elements from the incident light by a light shielding mechanism, the voltage control system comprising:
   a voltage application unit applying a bias voltage to the anode terminal;
   a multiplication state determination unit determining the multiplication state of the light shielding array part based on output signals from cathodes of the light receiving elements in the light shielding array part; and
   a voltage setting unit performing voltage setting for the bias voltage to be output from the voltage application unit based on the determination results from the multiplication state determination unit,
   wherein
   in the case of performing light exposure a predetermined number of times, the multiplication state determination unit determines that the light shielding array part is in the multiplied state when the number of light receiving elements each having a summed signal, obtained by summing output signals of the predetermined number of times, equal to or greater than a predetermined first threshold, is equal to or greater than a predetermined second threshold, and
   when the multiplication state determination unit does not determine that the light shielding array part is in the multiplied state, the voltage setting unit sets a set value of the bias voltage to be greater in absolute value than the previous set voltage.

3. A voltage control system including an array unit in which a plurality of light receiving elements are arranged and connected to a common anode terminal,
   the array unit having a light receiving array part receiving incident light and a light shielding array part shielding the light receiving elements from the incident light by a light shielding mechanism, the voltage control system comprising:
   a voltage application unit applying a bias voltage to the anode terminal;
   a multiplication state determination unit determining the multiplication state of the light shielding array part based on output signals from cathodes of the light receiving elements in the light shielding array part; and
   a voltage setting unit performing voltage setting for the bias voltage to be output from the voltage application unit based on the determination results from the multiplication state determination unit,
   wherein
   the multiplication state determination unit determines that the light shielding array part is in the multiplied state when multiplication is occurring in a cluster of a plurality of light receiving elements in the light shielding array part and/or when multiplication is also occurring in a nearby light receiving element a predetermined spacing away from a multiplied light receiving element in the light shielding array part, and
   when the multiplication state determination unit does not determine that the light shielding array part is in the multiplied state, the voltage setting unit sets a set value of the bias voltage to be greater in absolute value than the previous set voltage.

4. A voltage control system including an array unit in which a plurality of light receiving elements are arranged and connected to a common anode terminal,
   the array unit having a light receiving array part receiving incident light and a light shielding array part shielding the light receiving elements from the incident light by a light shielding mechanism, the voltage control system comprising:
   a voltage application unit applying a bias voltage to the anode terminal;
   a multiplication state determination unit determining the multiplication state of the light shielding array part based on output signals from cathodes of the light receiving elements in the light shielding array part; and
   a voltage setting unit performing voltage setting for the bias voltage to be output from the voltage application unit based on the determination results from the multiplication state determination unit,
   wherein
   when multiplication is occurring in a predetermined number or more of light receiving elements in a specific region of the light receiving array part, a light receiving element in the light shielding array part at a position a predetermined distance or longer away from the specific region is used for multiplication determination by the multiplication state determination unit.

5. A voltage control system including an array unit in which a plurality of light receiving elements are arranged and connected to a common anode terminal,
the array unit having a light receiving array part receiving incident light and a light shielding array part shielding the light receiving elements from the incident light by a light shielding mechanism, the voltage control system comprising:
a voltage application unit applying a bias voltage to the anode terminal;
a temperature sensor measuring an ambient temperature of the light receiving array part and the light shielding array part;
a temperature-voltage table having a set value of the bias voltage associated with each measured temperature and outputting set value information of the bias voltage corresponding to the measured temperature by the temperature sensor;
a multiplication state determination unit determining a multiplication state based on output signals from cathodes of the light receiving elements in the light shielding array part and updating the temperature-voltage table based on the determination results; and
a voltage setting unit performing voltage setting for the bias voltage to be output from the voltage application unit based on the set value information output from the temperature-voltage table.

6. The voltage control system of claim 5, wherein
the light receiving array part and the light shielding array part are housed in a sensor package, and
the temperature sensor is provided inside the sensor package.

7. The voltage control system of claim 5, wherein
the light receiving array part and the light shielding array part are housed in a sensor package, and
the temperature sensor is provided to be close to the sensor package.

8. The voltage control system of claim 5, wherein
the light receiving array part and the light shielding array part are housed in a sensor package in which a nonvolatile memory is incorporated, and
the temperature-voltage table acquires initial set value information of the bias voltage for each measured temperature from the nonvolatile memory in the sensor package.

* * * * *